United States Patent [19]

Kowshik et al.

[11] Patent Number: 4,858,185

[45] Date of Patent: Aug. 15, 1989

[54] ZERO POWER, ELECTRICALLY ALTERABLE, NONVOLATILE LATCH

[75] Inventors: Vikram Kowshik; Elroy M. Lucero, both of San Jose, Calif.

[73] Assignee: National Semiconductor Corporation, Santa Clara, Calif.

[21] Appl. No.: 149,568

[22] Filed: Jan. 28, 1988

[51] Int. Cl.$^4$ .................. G11C 11/40; G11C 13/00
[52] U.S. Cl. .................... 365/181; 365/185; 365/154; 365/189.05; 365/227
[58] Field of Search ............ 365/181, 185, 227, 230, 365/154, 189.05

[56] References Cited

U.S. PATENT DOCUMENTS

| | | | |
|---|---|---|---|
| 4,132,904 | 1/1979 | Harari | 307/238 |
| 4,328,565 | 5/1982 | Harari | 365/185 |
| 4,409,723 | 10/1983 | Harari | 29/571 |
| 4,486,769 | 12/1984 | Simko | 357/41 |
| 4,571,704 | 2/1986 | Bohac, Jr. | 365/156 |
| 4,599,706 | 7/1986 | Guterman | 365/185 |
| 4,628,487 | 12/1986 | Smayling | 365/185 |
| 4,695,979 | 9/1987 | Tuvell et al. | 365/185 |

Primary Examiner—Terrell W. Fears
Attorney, Agent, or Firm—Limbach, Limbach & Sutton

[57] ABSTRACT

A compact, nonvolatile, zero static power, electrically alterable, bistable CMOS latch device is fabricated with single layer of polysilicon. The single polysilicon layer forms the floating gates of the nonvolatile elements of the device. The control gates are formed in the substrate by buried N+ diffusions and are separated from their respective floating gates by a thin oxide dielectric. The circuit can be designed to power-up in a preferred mode even before any programming operation has been performed on it. Thereafter, the circuit is available to be programmed to either of its two stable states. After the programming operation is completed and the circuit is latched to one of its two stable states, the fields across the thin oxide dielectrics are minimal and virtually no read disturb condition exist. Thus, the latch also offers excellent data retention characteristics.

8 Claims, 4 Drawing Sheets

ZERO POWER, ELECTRICALLY ALTERABLE, NONVOLATILE LATCH

BACKGROUND OF THE INVENTION

1. Field of the Invention

The present invention relates to an electrically alterable nonvolatile latch element which can be used as a basic element in the construction of electrically reconfigurable logic blocks.

2. Description of the Prior Art

Electrically erasable and programmable read only memory devices and their different manifestations are now being designed into new applications beyond the traditional domain of nonvolatile memories. Programmable logic arrays which until recently were offered only in fusible link technology are now being offered in nonvolatile memory technologies.

One disadvantage of fusible link technology is that it requires substantial chip area to fabricate the fusible link elements. Also, the programming circuitry required to "blow" the fusible link needs to be large because the link requires a relatively large amount of current to flow through it to "blow" with a certain degree of reliability.

Another technique, known as the laser link technique, utilizes a highly directed laser beam to selectively separate the links in a memory circuit with redundant rows or columns. This technique allows the replacement of a limited number of defective memory locations with the redundant memory locations.

A disadvantage of this technique is that it requires substantial investment in capital equipment to implement.

Another major drawback of the two above-mentioned approaches is that their usefulness is limited by the fact that they are only pre-packaging reconfigurable, i.e. they are not in-circuit programmable.

Integrated circuit devices are now being designed wherein nonvolatile EPROM elements are replacing the fusible links, as in the case of programmable logic arrays and the above-mentioned redundancy circuits. This approach solves the problem of pre-packaging reconfiguration, but it still suffers from high current and voltage requirements. It also requires the use of an external power supply for programming operations and UV light for erasing one prototype configuration before the device can be reconfigured. Thus, the flexibility of in-circuit programming is not available with the EPROM approach.

Several other types of nonvolatile memory elements are disclosed in U.S. Pat. Nos. 4,328,565; 4,409,723; 4,486,769; 4,599,706. However, these memory elements are primarily designed for high cell count memories and are not self-sufficient in that they require relatively complex sense amplifiers and have relatively poor noise immunity.

Additionally, nonvolatile latch circuits have been proposed in U.S. Pat. Nos. 4,132,904 (Harari) and 4,571,704 (Bohac).

U.S. Pat. No. 4,132,904 discloses a volatile/nonvolatile logic latch circuit with a pair of circuit branches, each comprising a field effect transistor and a floating gate field effect transistor connected in series. The control gates of the floating gate field effect transistors are cross-coupled to the common junctions of the series-connected transistors in the other branch. This circuit can be programmed to assume the desired state when power is turned on and can also be intentionally written over if complementary data is to be stored.

U.S. Pat. No. 4,571,704 discloses a nonvolatile latch circuit which assumes the proper state when power is applied to the circuit, irrespective of the power applying conditions. This is accomplished by configuring a pair of circuit branches with each branch comprising a field effect transistor connected in series with a floating gate field effect transistor. The gates of the normal field effect transistors are cross-coupled to the common junctions between the series transistors in the other circuit branch. Also, the control gates of the floating gate field effect transistors are capacitively cross-coupled to the floating gates of the transistors in the other branch.

In the latch proposed by Bohac, if both the nonvolatile memory transistors in the two circuit branches are off (which is normally the case for enhancement floating gate MOSFETs when a device first comes out of wafer fabrication), then when power is turned on, the outputs of the nonvolatile latch are indeterminate since no pull-down to VSS is available until after the memory elements have been programmed.

SUMMARY OF THE INVENTION

An electrically programmable latch in accordance with the present invention includes two basic components: (a) two nonvolatile memory cell elements and (b) one cross-coupled static latch. The two nonvolatile memory cell elements are metal-oxide-semiconductor field effect transistor (MOSFET) devices which form the two branches of the circuit module. The floating gates of the nonvolatile memory cell elements in the two branches are capacitively coupled to their respective control gates via coupling capacitors which are formed by the overlap area between the control gate and the floating gate with a thin oxide dielectric separating the floating gates from the control gates. In addition to being capacitively coupled to their respective control gates, the floating gate of one memory cell element in one branch is capacitively coupled to the control gate of the other memory cell element in the other branch and vice-versa. This capacitive cross-coupling is achieved via relatively small area tunneling capacitors commonly known to those skilled in the art as Fowler-Nordheim capacitors. The drain of the nonvolatile memory cell element in one branch is coupled to the input of a complementary metal-oxide-semiconductor (CMOS) inverter, while the drain of the nonvolatile memory cell element in the other branch is coupled to the input of a second CMOS inverter. The output of the first CMOS inverter is coupled to the input of the second CMOS inverter which is also coupled to the drain of the nonvolatile memory element in the second branch. Likewise, the output of the second CMOS inverter is coupled to the input of the first CMOS inverter which is also coupled to the drain of the nonvolatile memory element in the first branch. The two cross-coupled CMOS inverters form a configuration which is commonly known to those skilled in the art as a static cross-coupled latch. The cross-coupled CMOS inverters are intended to sense the state of the two nonvolatile memory elements in the two branches and present the appropriate levels on the output lines.

To program the latch, data input circuitry is employed which can selectively place either a net positive or a net negative charge on the floating gate of one nonvolatile memory element in one circuit branch while simultaneously putting a net negative or a net positive charge on the floating gate of the other nonvolatile element in the other branch. The nonvolatile memory element with a net negative charge on the floating gate operates in the enhancement mode (i.e. no current flows through the element when its control gate is held at ground potential) and is popularly known to be "ERASED" in nonvolatile memory lo terminology. The nonvolatile memory element with a net positive charge on the floating gate operates in the depletion mode (i.e. current flows through the element when its control gate is held at ground potential) and is popularly known to be "WRITTEN" in nonvolatile memory terminology.

When power is removed form the device, the data in the cross-coupled inverter latch is lost; when power is brought back to the device, the states of the nonvolatile memory elements in the two branches are sensed at the inputs of the inverters which form the cross-coupled latch. Depending on the states of the nonvolatile memory elements (which are normally complementary to one another in the two branches of the circuit module), the cross-coupled inverters quickly latch in the proper state by feeding the proper voltage level at the input of the other inverter.

Thus, the present invention offers an electrically alterable latch which can be used in a myriad of applications where certain functions (for example, a standard EEPROM or a standard logic chip with nonvolatile latch elements) need to be customized to meet particular requirements. Another possible application is the EE-DIP switch, wherein the pins may be reconfigured according to desired requirements by inputting a certain instruction to the device.

In a particular application, the electrically alterable latch of the present invention has been designed into the logic module of a reconfigurable EEPROM device in which different sections of the memory core array can be reconfigured to be accessed by the outside world. This latch has also been utilized as a building block for a nonvolatile address pointer which is used to disable write operations in the user-defined section of the memory array core. This provides security of critical data from being accidentally written over.

Other objects, features and advantages of the present invention will be understood and appreciated by reference to the detailed description of the invention provided below which should be considered in conjunction with the accompanying drawings.

DETAILED DESCRIPTION OF THE INVENTION

Figure 1:
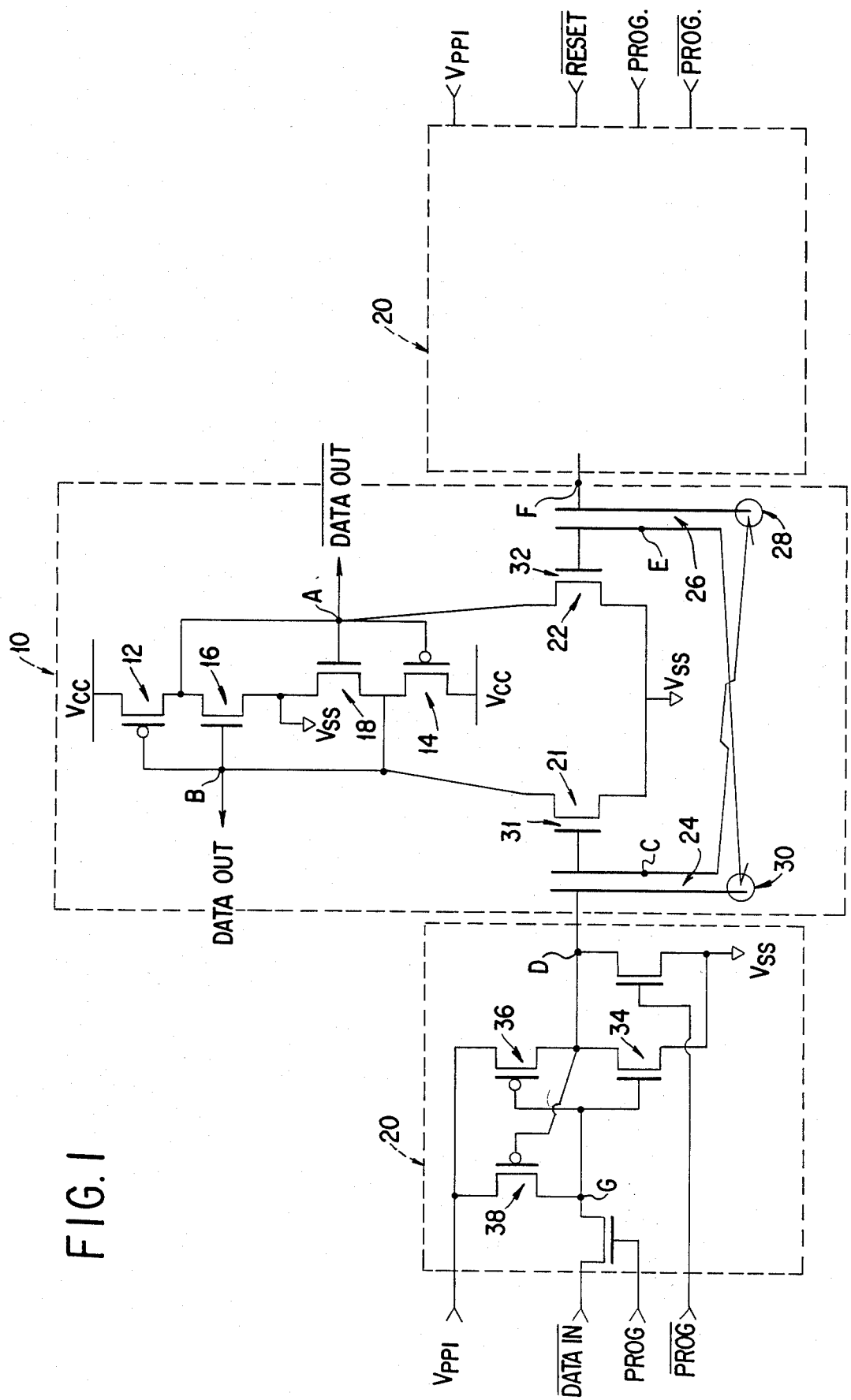
FIG. 1 is a schematic diagram illustrating a zero power, electrically alterable, nonvolatile latch in accordance with the present invention, together with a high voltage inverter circuit.

An embodiment of an electrically alterable nonvolatile latch element in accordance with the present invention, along with an associated high voltage inverter circuit, is illustrated in FIG. 1.

The basic latch circuit 10 comprises two subcircuits. The first subcircuit is a cross-coupled static latch which includes two P-channel field effect transistors 12 and 14 and two N-channel field effect transistors 16 and 18. The second subcircuit includes two nonvolatile memory transistors 21 and 22.

The drains of transistors 12 and 16 are coupled to each other at node A. The drains of transistors 14 and 18 are coupled to each other at node B. The sources of transistors 12 and 14 are connected to the positive supply potential VCC. The sources of transistors 16 and 18 are connected to the ground potential VSS. The gates of transistors 12 and 16 are coupled together and are also coupled to node B.

Figure 3:
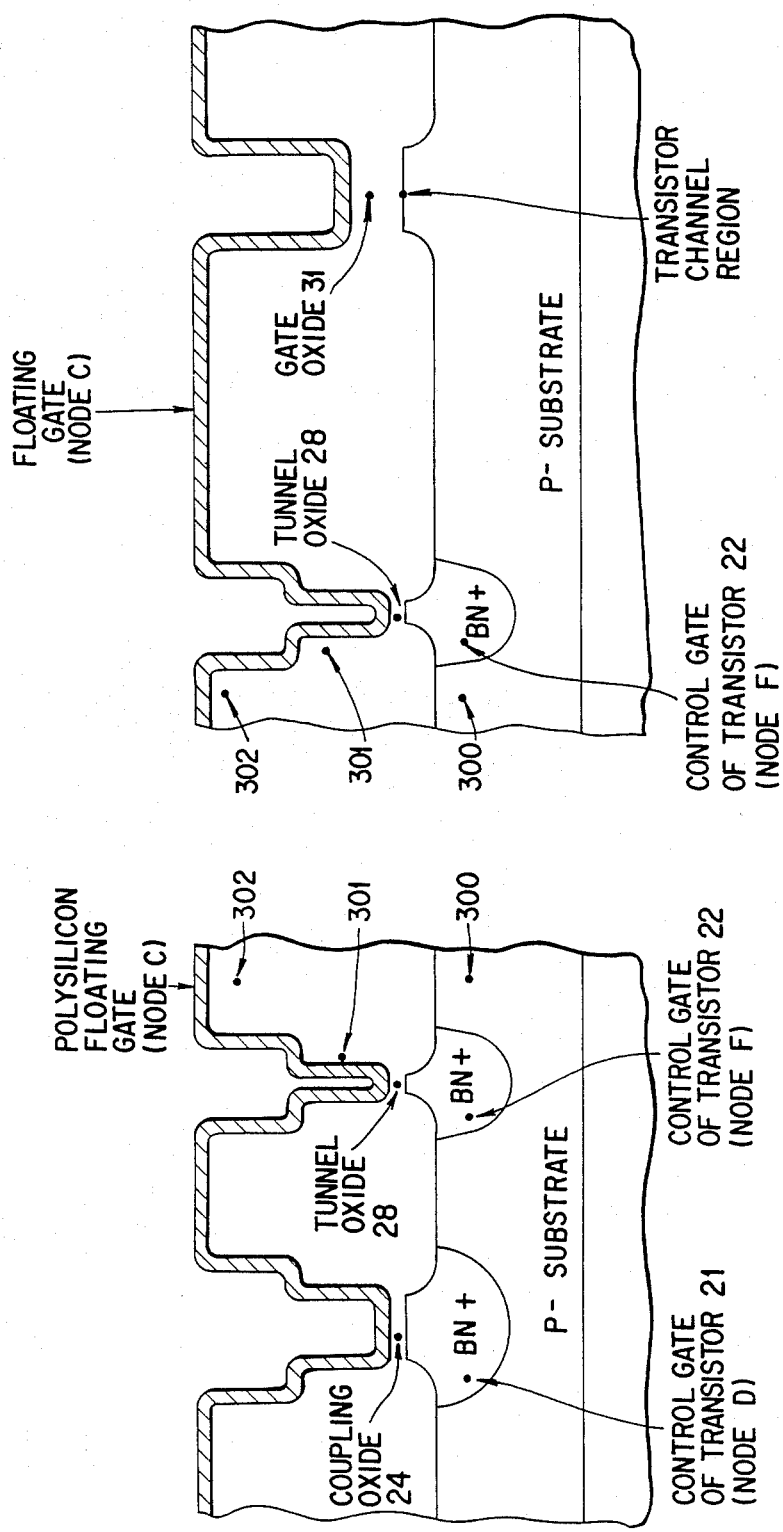
FIG. 3A is a cross-sectional view taken along line AA in FIG. 2.
FIG. 3B is a cross-sectional view taken along line BB in FIG. 3.

Transistors 21 and 22 are N-channel floating gate MOSFET devices in which the floating gates are formed in a polysilicon layer and the control gates are selectively defined in the bulk silicon by a buried N+ implant mask. The floating gate (node C) of the memory transistor 21 is capacitively coupled to its control gate (node D) via coupling capacitor 24. Coupling capacitor 24 is essentially formed by the overlap of the floating polysilicon gate and the buried N+ implant area exposed by the thin oxide mask, as illustrated in FIG. 3A. Likewise, the floating gate (node E) of the memory transistor 22 is capacitively coupled to its control gate (node F) via the coupling capacitor 26.

In addition to being capacitively coupled to their respective control gates, the floating gates of the transistors 21 and 22 are capacitively cross-coupled to the control gates of transistors 22 and 21, respectively, via relatively small area tunneling capacitors 28 and 30. As shown in FIG. 3B, the tunneling capacitors 30 and 28 are formed by the overlap of the floating gates of transistors 21 and 22 with the buried N+ implant areas which are exposed by the thin oxide mask and are electrically in common with the control gates of transistors 22 and 21, respectively. Both the coupling capacitors 24, 26 and the tunneling capacitors 28, 30 have relatively thin oxide (100 Angstroms) dielectrics between the floating gates and the control gates.

The drain of the memory element 21 is coupled to node B, which was defined in conjunction with the cross-coupled static latch. Similarly, the drain of the memory element 22 is coupled to node A, which was previously defined. The sources of both memory elements 21 and 22 are connected to the ground potential VSS.

Figure 2:
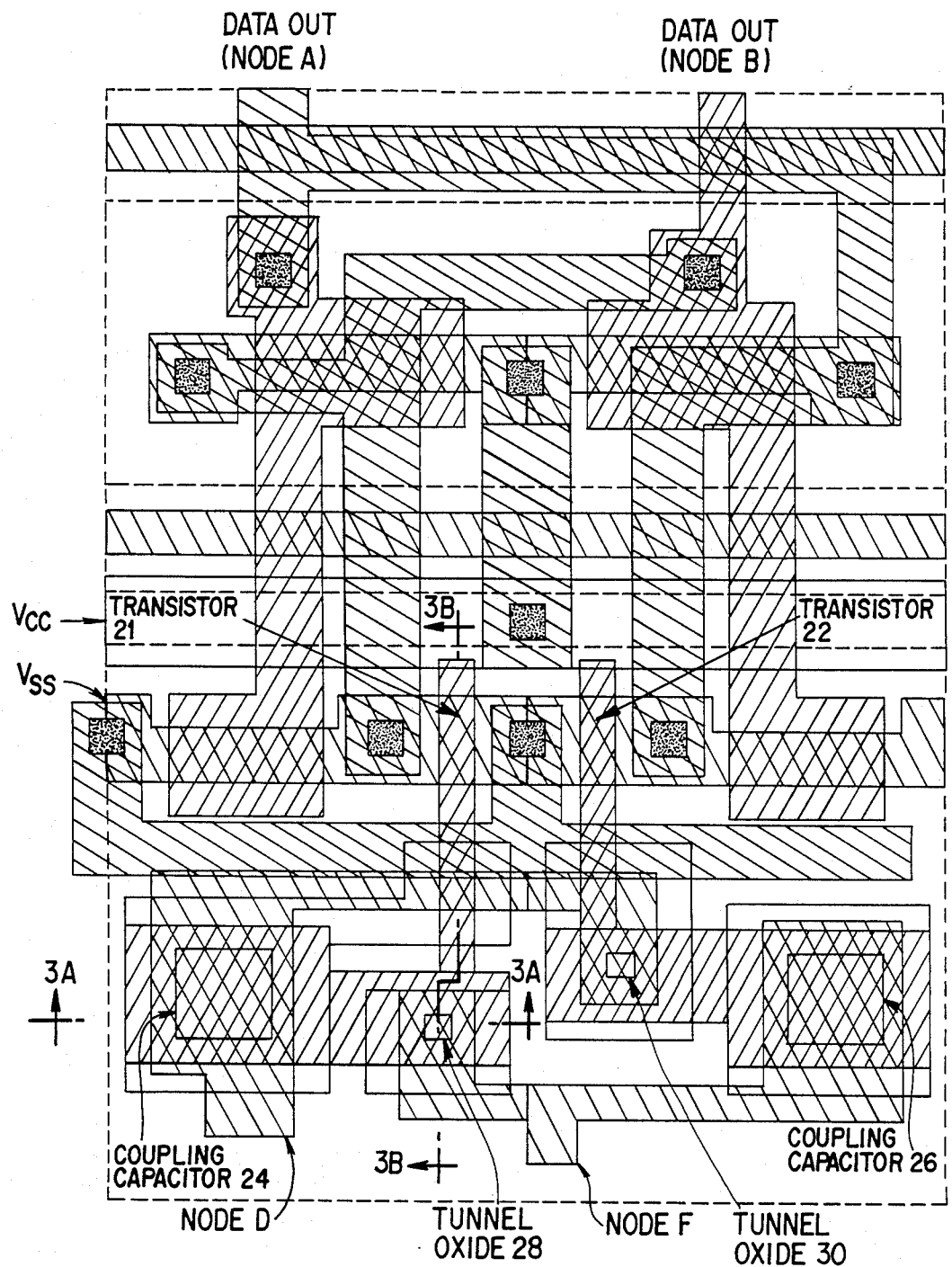
FIG. 2 is a schematic diagram illustrating a layout of the FIG. 1 circuit.

In addition to the capacitive couplings indicated above, there are additional stray capacitances inherent in the layout of the latch shown in FIG. 2. These include the floating gate to control gate overlap capacitances in the non thin-oxide areas and the capacitance due to the source and drain overlap to the floating gate in the memory transistors.

FIGS. 3A and 3B show the cross-sectional views of the memory cell element along the cross-sections AA and BB as indicated on the layout of the latch in FIG. 2.

In FIG. 3A, region 300 comprises the P-type silicon in which the highly doped N+ source and drain regions are formed for the N-channel CMOS transistors. Also formed in the region 300 are buried-N+ diffusions which are not as highly doped compared to the source/drain N+ regions. The buried-N+ regions are used to form the control gates of the memory transistors and can also be used for conductive underpasses in other parts of the circuitry. The control gates of transistors 21 and 22 are shown in the cross-sectional diagrams of FIGS. 3A and 3B. The floating gates of transistors 21 and 22 (nodes C and E, respectively) are also shown in FIGS. 3A and 3B and are comprised of conductive polycrystalline silicon. The floating polycrystalline gate of transistor 21 is separated from the crystalline silicon by the coupling oxide 24, the tunneling oxide 28, the gate oxide 31, the oxide over the buried-N+ region 301, and the field oxide 302. The oxide over the buried N+, region 301, is substantially thicker than the gate oxides 30 and 32. The field oxide, region, 302, is substantially thicker than the oxide in region 301.

In addition to the capacitive couplings "Ccoup" and "Ctun," due to the coupling and tunneling oxides respectively, the floating gate of the transistor 21 is also capacitively coupled to its own control gate due to the overlap of the floating polysilicon gate to its control gate formed by the oxide over the buried-N+ region in the silicon substrate, "Cbn+g." Another component of the capacitance, "Cfld," is due to the overlap of the floating polysilicon gate to the substrate in the field oxide regions 302.

In order to program the latch, a high programming voltage "VPPI" (12–17v) must be applied to one of the two programming nodes D or F for about 5–10 ms. Considering the case in which VPPI is applied to node D, then the other programming node F must be held at the ground potential. For a virgin cell with no charge on the floating gate, an initial voltage equal to Rg "VPPI appears across the tunnel oxide 28, where;

$$Rg = \frac{Ccoup + Cbn + g}{Ccoup + Cbn + g + Ctun + Cfld + Cgox + Cbn + t} \quad (1)$$

where: p0 Rg : Control gate coupling ratio of Memory element,
Ccoup: Floating gate to Control gate capacitance due to the coupling oxide,
Cbn+g: Floating gate to Control gate capacitance due to the buried N+ oxide around the gate region,
Ctun: Floating gate to Control gate of adjacent cell capacitance due to the tunnel oxide,
Cfld: Floating gate to substrate capacitance due to the field oxide,
Cgox: Floating gate to substrate capacitance due to the gate oxide,
Cbn+t: Floating gate to Control gate of adjacent cell capacitance due to the buried-N+ oxide around the tunnel oxide.

The initial electric field "E" across the tunnel oxide is given by:

$$E = \frac{Rg \cdot VPPI}{Ttun} \quad (2)$$

where,
Ttun: Thickness of tunnel oxide,
VPPI: Voltage applied to the Control gate of the memory cell.

If the initial electric field "E" is of the order of 9–10 Mv/cm, then a sufficient number of electrons tunnel through the tunnel oxide onto the floating gate of transistor 21 storing a net negative charge on node C so as to make an appreciable positive shift in the threshold voltage of this device. Also, the floating gate of transistor 22 is capacitively coupled up to an initial voltage equal to Rg . VPPI, where:

$$Rg = \frac{Ctun + Cbn + t}{Ccoup + Cbn + g + Ctun + Cfld + Cgox + Cbn + t} \quad (3)$$

The initial electric field across the tunnel oxide associated with the floating gate of transistor 22 is given by:

$$E = \frac{VPPI - Rg \cdot VPPI}{Ttun} \quad (4)$$

If the initial electric field "E" is of the order of 9–10 Mv/cm, then a sufficient number of electrons tunnel through the tunnel oxide out of the floating gate of transistor 22 storing a net positive charge on node E so as to make an appreciable negative shift in the threshold voltage of this device.

The operation of positive threshold voltage shift by the application of high voltage, VPPI, to the nonvolatile memory element is known as "ERASE" and the operation of negative threshold voltage shift is known as "WRITE" in EEPROM terminology.

Both the ERASE and WRITE operations are self-limiting. During ERASE, the initial electric field "E" sets up a Fowler-Nordheim conduction of electrons which follows the following relationship:

$$I\text{ init(erase)} = a \cdot A \cdot E_2 \cdot \exp^{\frac{(-B)}{(E)}} \quad (5)$$

The field "E" however decreases with time as more and more electrons tunnel through the tunnel oxide and are collected on the floating polycrystalline gate. Eventually, the electric field "E" is so low that very few electrons tunnel through the oxide and further threshold voltage shift is negligible. Similarly, during the WRITE operation, the initial electric field "E'" sets up a Fowler Nordheim conduction which follows the relationship:

$$I\text{ init(write)} = a1 \cdot A \cdot E'_2 \cdot \exp^{\frac{(-B1)}{(E')}} \quad (6)$$

where: a, al, B, B1 are physical constants which depend on the effective energy barrier heights at the injection interfaces and the effective mass ratio of electrons in the tunnel dielectric. A is the area of the tunnel dielectric.

During the WRITE operation, the electric field "E'" also decreases with time as more electrons tunnel through the tunnel oxide out of the floating gate and eventually leaving the floating gate with a net positive charge. The electric field "E'"at this point is so low that very few electrons tunnel through the tunnel oxide and further threshold voltage shift is negligible.

During the READ mode, the control gates of both the memory elements (nodes D and F) are held at the ground potential and the electric fields across the tunnel oxides are minimal and are only due to the charges on the floating gates due to the programming operation. The tunneling of charges at these low electric fields is negligible and this translates to long data retention times (on the order of 10 years or longer for $Tj < \text{or} = 150°$ C.). Thus, the two memory elements in the electrically alterable latch remain programmed to their respective ERASED (enhancement) and WRITTEN (depletion) states. For the case when transistor 21 is ERASED and transistor 22 is WRITTEN (see FIG. 1), when the power is first turned on to the device, the following sequence of events occur:

(a) Node A is pulled low because transistor 22 is ON and is in the depletion mode;

(b) Node A going low forces the inverter formed by transistors 14 and 18 to try to force its output high. Transistor 21 being OFF (ERASED) allows node B to pull up towards VCC;

(c) The high going node B forces the output (i.e., node A) of the inverter formed by transistors 12 and 16 further towards the ground potential.

Eventually, due to the positive feedback, node B pulls up to VCC and node A is pulled down to VSS. At this point, the two cross-coupled inverters are latched to their proper states and no dc power is consumed by the circuit.

For the proper operation of the latch, the current sinking capability of the written memory element should be such that it can pull the corresponding cross-coupled latch node low enough to set the latch to its proper programmed state.

The basic latch circuit 10 described above can be used in conjunction with a high voltage inverter circuit 20, as shown in FIG. 1.

The purpose of the circuit 20 is to translate the low (VSS) and high (VCC) CMOS levels at its input into high (VPPI 12-17v) and low (VSS) levels respectively. Thus, during the programming mode (PROG=VCC, PROGB=VSS) if DATAINB=low CMOS level, then node G is pulled low; this turns N-channel MOSFET 34 OFF and P-channel MOSFET 36 ON. This allows node D to pull up to VPPI and turn P-channel MOSFET 38 OFF.

For the other case, when the DATAINB=high CMOS level during the programming mode, node G pulls up towards the CMOS high level, thereby turning N-channel MOSFET 34 ON and P-channel MOSFET 36 OFF. Node D is pulled down to VSS, thereby turning P-channel MOSFET 38 ON which pulls node G towards VPPI. Thus, circuit 20 works like a high voltage inverter.

A similar circuit block 20 is also connected to the control gate of memory element 22 shown in FIG. 1. This circuit can be used to reset the DATAOUT (Node B) of the nonvolatile latch to a low (VSS) state, by taking the RESETB signal low during the program cycle.

Figure 4:
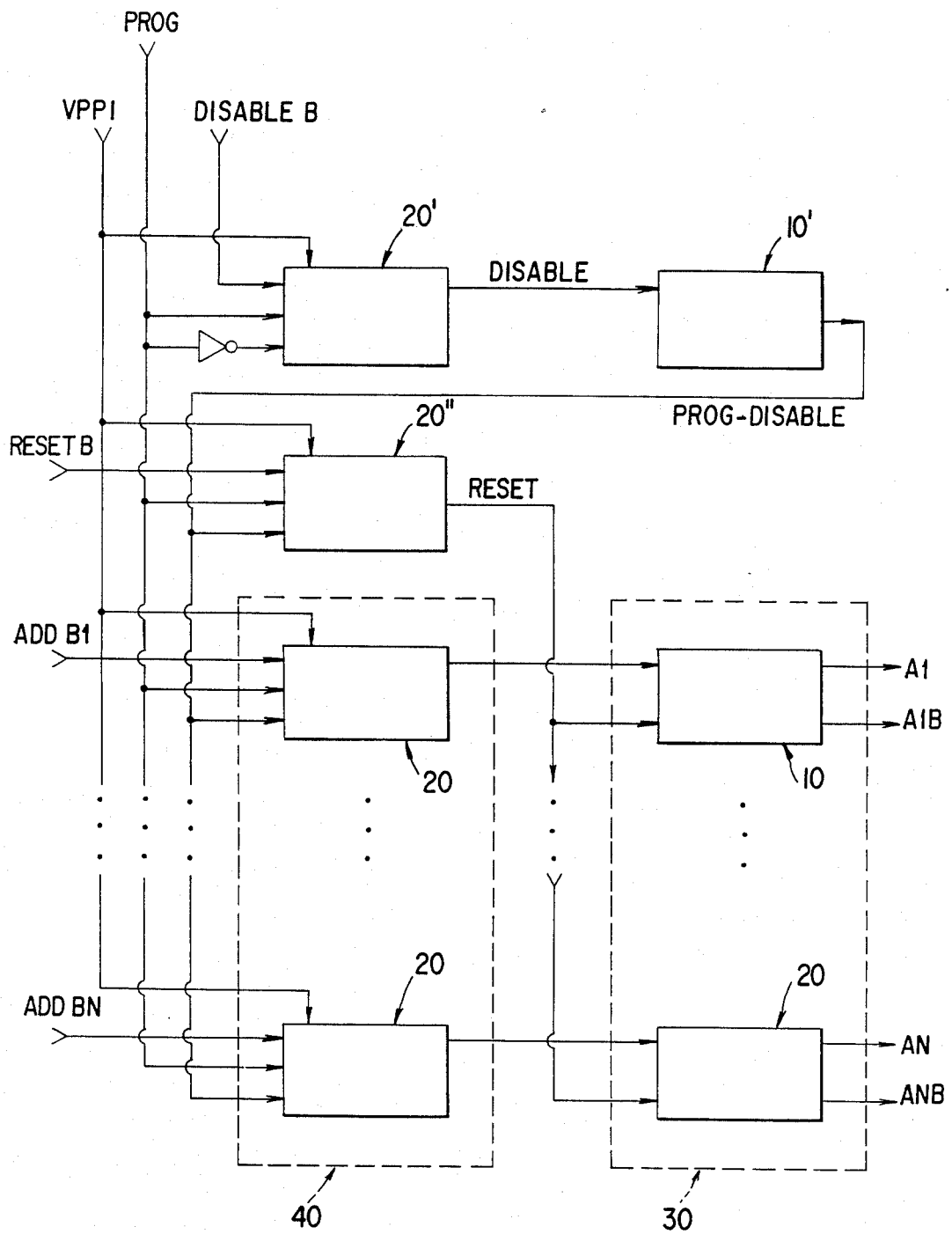
FIG. 4 is a block diagram illustrating a circuit application in which the nonvolatile latch of the present invention can be used.

FIG. 4 shows one possible setup in which the nonvolatile latch could be used.

Circuit block 30 includes an "N" bit long register which has the nonvolatile latch circuit 10 described above as the basic building block. The circuit block 40 includes "N" high voltage inverter circuits 20 described above, the outputs of each feeding into the input of a corresponding nonvolatile latch 10 in the block 30.

In addition to the "N" nonvolatile latch elements in the circuit block 30 and the "N" high voltage inverters in the circuit block 40, there is one additional nonvolatile latch element and two additional high voltage inverters shown in FIG. 4. All the high voltage inverters have VPPI and PROG as common inputs. The top circuit block 20' has "PROGB" and "PROG-DISABLEB" as the other inputs and its output "DISABLE" feeds into the control gate of one of the memory elements of the additional circuit block 10'. The control gate of the other memory element in the circuit block 10 is connected to VSS. The output "PROG-DISABLE" of the circuit block 10 serves as a common input to the remaining N+1 high voltage inverters. The second high voltage inverter 20" outside of the circuit block 40 has its last remaining input connected to a signal called "RESETB" and its output "RESET" is connected to one input of each nonvolatile element in the circuit block 30. The last input of each high voltage inverter element in the circuit block 40 is connected to the input of the corresponding nonvolatile latch in the circuit block 30 as shown in FIG. 4.

The transistor ratios of the cross-coupled inverters in the circuit block 10 outside of the circuit block 30 can be set such that the circuit powers up with PROG-DISABLE=VSS before the first PROG-DISABLE operation is performed. This enables the RESET operation to be performed on all the nonvolatile elements in the circuit block 30. The RESET operation resets all bits A0-AN to 0s'. Next the desired bit pattern ADDBI - ADDBN can be input to the circuit block 40 along with the other inputs VPPI (12-17V), PROG=VCC, DISABLE=VSS valid during the program cycle. After the programming cycle (typically 5-10 ms) the bit pattern A0-A7 should be identical to the desired bit pattern ADD1-ADDN that was input to the circuit block 40.

Once the desired bit pattern is programmed in the circuit block 30 is can be disabled from further pattern changes by performing a PROG-DISABLE operation. This is done by taking the PROG-DISABLE input to VSS during the programming operation with RESETB and ADDB1-ADDBN all at VCC. This operation makes the signal PROG-DISABLE permanently high thereby disabling all future pattern changes in the circuit block 30.

It should be noted that the example described above is merely for illustrative purpose and is only one of the many possible configurations which represent the application of the present invention.

What is claimed is:

1. An electrically alterable nonvolatile latch element comprising:
   (a) a static latch element comprising first and second cross-coupled inverter elements wherein the output of the first inverter element is connected to the input of the second inverter element and the output of the second inverter element is connected to the input of the first inverter element;
   (b) a first nonvolatile storage element which stores a first charge state, the first storage element being connected to provide the first charge state to the input of the first inverter element under preselected conditions; and
   (c) a second nonvolatile storage element which stores a second charge state complementary to the first charge state, the second storage element being connected to provide the second charge state to the input of the second inverter element under the preselected conditions such that the first and second nonvolatile storage elements simultaneously store the first and second complementary charge states, respectively.

2. An electrically alterable nonvolatile latch element as in claim 1 and further including means for reversing the respective charge states stored in the first and second storage elements under second preselected conditions such that the first and second nonvolatile storage elements simultaneously store the second and first complementary charge states, respectively, under the second preselected conditions.

3. An electrically alterable nonvolatile latch element comprising:
   (a) first and second nonvolatile floating gate field effect transistor (FET) memory cell elements, the floating gates of the memory cell elements being capacitively coupled to their respective control gates, the floating gate of the first memory cell element being capacitively coupled to the control gate of the second memory cell element, the floating gate of the second memory cell element being capacitively coupled to the control gate of the first memory cell element; and
   (b) a static cross-coupled latch including first and second invertor elements, the drain of the first memory cell element being connected to the input of the first invertor element, the drain of the second memory cell element being connected to the input of the second invertor element, the output of the first invertor element being connected to the input of the second invertor element which is also connected to the drain of the second memory cell element, the output of the second invertor element is connected to the input of the first invertor element which is also connected to the drain of the first memory cell element.

4. An electrically alterable nonvolatile latch element as in claim 3 and further including means for programming the latch element by selectively placing either a net positive or a net negative charge on the floating gate of one of the first or second memory cell elements while simultaneously placing an opposite charge on the floating gate of the other memory cell element.

5. An electrically alterable non-volatile latch element as in claim 4 wherein the static cross-coupled latch comprises first and second P-channel FETs and first and second N-channel FETs, the drains of the first P-channel FET and the first N-channel FET and of the second P-channel FET and the second N-channel FET, respectively, being commonly connected, the sources of the first and second P-channel FETs being commonly connected to a first potential, the sources of the first and second N-channel FETs being commonly connected to a second potential more negative than the first potential, the gates of the first P-channel FET and the first N-channel FET being commonly connected to the drain of the first memory cell element and to a first output, the gates of the second P-channel FET and the second N-channel FET being commonly connected to the drain of the second memory cell element and to a second output, the sources of the first and second memory cell elements being commonly connected to the second potential.

6. An electrically alterable nonvolatile latch element comprising:
   (a) first and second nonvolatile floating gate field effect transistor (FET) memory cell elements, the floating gates of the memory cell elements being capacitively coupled to their respective control gates, the floating gate of the first memory cell element being capacitively coupled to the control gate of the second memory cell element, the floating gate of the second memory cell element being capacitively coupled to the control gate of the first memory cell element, wherein capacitive coupling between the floating gate and the control gate of the first and second memory cell elements is via first and second tunnelling capacitors, respectively, each of the tunnelling capacitors being formed by the overlap of its associated floating gate and a buried N+ implant area separated from the associated floating gate by a dielectric layer;
   (b) a static cross-coupled latch element comprising first and second P-channel FETS and first and second N-channel FETs, the drains of the first p-channel FET and the first N-channel FET and of the second P-channel FET and the second N-channel FET, respectively, being commonly connected, the sources of the first and second P-channel FETs being commonly connected to a first potential, the sources of the first and second N-channel FETs being commonly connected to second potential more negative than the first potential, the gates of the first P-channel FET and the first N-channel FET being commonly connected to the drain of the first memory cell element and to a first output, the gates of the second P-channel Fet and the second N-channel FET being commonly connected to the drain of the second memory cell element and to a second output, the sources of the first and second memory cell elements being commonly connected to the second potential; and
   (c) means for programming the latch element by selectively placing either a net positive or a net negative charge on the floating gate of one of the first or second memory cell elements while simultaneously placing a complementary charge on the floating gate of the other memory cell element.

7. An electrically alterable nonvolatile latch element as in claim 6 wherein the floating gates of the first and second memory cell elements are capacitively cross-coupled to the control gates of the second and first memory cell elements, respectively, via first and second tunneling capacitors, respectively, each of said tunneling capacitors being formed by an overlap of its associated floating gate and a buried N+ implant area separated from the associated floating gate by a dielectric layer.

8. An electrically alterable nonvolatile latch element as in claim 6 wherein the means for programming comprises a high voltage inverter circuit which includes:
   (a) a first N-channel FET device (34) having its source connected to the second potential, its drain connected to the control gate of the first memory cell element, and its gate connected to an enabling potential;
   (b) a first P-channel FET device (36) having its drain connected to the drain of the first N-channel FET device (34), its source connected to receive a programming voltage (VPPI) and its gate connected to the gate of the first N-channel FET device (34);
   (c) a second P-channel FET device (38) having its drain connected to the commonly connected gates of the first N-channel FET device (34) and the first P-channel FET device (36), its source connected to receive the programming voltage (VPPI) and its gate connected to the control gate of the first memory cell element; and
   (d) means for coupling the control gate of the second memory cell element to the second potential.

* * * * *